(12) United States Patent
Zhang et al.

(10) Patent No.: US 6,797,548 B2
(45) Date of Patent: Sep. 28, 2004

(54) ELECTRO-OPTICAL DEVICE AND THIN FILM TRANSISTOR AND METHOD FOR FORMING THE SAME

(75) Inventors: Hongyong Zhang, Yamato (JP); Naoto Kusumoto, Atsugi (JP)

(73) Assignee: Semiconductor Energy Laboratory Co., Inc., Kanagawa-ken (JP)

( * ) Notice: Subject to any disclaimer, the term of this patent is extended or adjusted under 35 U.S.C. 154(b) by 0 days.

(21) Appl. No.: 10/011,708

(22) Filed: Dec. 11, 2001

(65) Prior Publication Data

US 2002/0042171 A1 Apr. 11, 2002

Related U.S. Application Data

(62) Division of application No. 09/291,279, filed on Apr. 14, 1999, now Pat. No. 6,335,213, which is a division of application No. 09/045,696, filed on Mar. 23, 1998, now Pat. No. 6,124,155, which is a division of application No. 08/455,067, filed on May 31, 1995, now Pat. No. 5,811,328, which is a division of application No. 08/260,751, filed on Jun. 15, 1994, now Pat. No. 5,648,662, which is a continuation of application No. 07/895,029, filed on Jun. 8, 1992, now abandoned.

(30) Foreign Application Priority Data

Jun. 19, 1991 (JP) ............................................. 3-174541

(51) Int. Cl.⁷ .......................... H01L 21/20; H01L 21/84

(52) U.S. Cl. ...................... 438/152; 438/154; 438/155; 438/162; 438/166

(58) Field of Search ................................ 438/151, 152, 438/166, 162

(56) References Cited

U.S. PATENT DOCUMENTS 4,368,523 A 1/1983 Kawate
4,514,253 A 4/1985 Minezaki
4,561,906 A 12/1985 Calder et al.

(List continued on next page.)

FOREIGN PATENT DOCUMENTS

| EP | 0 416 798 A2 | 3/1991 |
| EP | 0 456 199 | 11/1991 |
| JP | 58-2073 | 1/1983 |

(List continued on next page.)

OTHER PUBLICATIONS

Hayzelden et al., "In Situ Transmission Electron Microscopy Studies of Silicide–Mediated Crystallization of Amorphous Silicon", Appl. Phys. Lett., vol. 60, No. 2, Jan. 13, 1992, pp. 225–227.

Hempel et al., "Needle–Like Crystallization of Ni Doped Amorphous Silicon Thin Films", Solid State Communications, vol. 85, No. 11, Mar. 1993, pp. 921–924.

Dvurechenskii et al., "Transport Phenomena in Amorphous Silicon Doped by Ion Implantation of 3d Metals", Phys. Stat. Sol. (a), vol. 95, (1986), pp. 635–640.

(List continued on next page.)

Primary Examiner—Michael Lebentritt
(74) Attorney, Agent, or Firm—Eric J. Robinson; Robinson Intellectual Property Law Office

(57) ABSTRACT

A method of fabricating silicon TFTs (thin-film transistors) is disclosed. The method comprises a crystallization step by laser irradiation effected after the completion of the device structure. First, amorphous silicon TFTs are fabricated. In each of the TFTs, the channel formation region, the source and drain regions are exposed to laser radiation illuminated from above or below the substrate. Then, the laser radiation is illuminated to crystallize and activate the channel formation region, and source and drain regions. After the completion of the device structure, various electrical characteristics of the TFTs are controlled. Also, the amorphous TFTs can be changed to polysilicon TFTs.

115 Claims, 8 Drawing Sheets

U.S. PATENT DOCUMENTS

| | | | |
|---|---|---|---|
| 4,582,395 A | 4/1986 | Morozumi | |
| 4,619,034 A | 10/1986 | Janning | |
| 4,624,737 A | 11/1986 | Shimbo | |
| 4,651,408 A | 3/1987 | MacElwee et al. | |
| 4,746,628 A | 5/1988 | Takafuji et al. | |
| 4,778,773 A | 10/1988 | Sukegawa | |
| 4,797,108 A | 1/1989 | Crowther | |
| 4,803,536 A | 2/1989 | Tuan | |
| 4,838,654 A | 6/1989 | Hamaguchi et al. | |
| 4,851,363 A | 7/1989 | Troxell et al. | |
| 4,864,376 A | 9/1989 | Aoki et al. | |
| 4,948,231 A | 8/1990 | Aoki et al. | |
| 4,959,700 A | 9/1990 | Yamazaki | |
| 4,960,719 A | 10/1990 | Tanaka et al. | |
| 4,963,503 A | 10/1990 | Aoki | |
| 4,998,152 A | 3/1991 | Batey et al. | |
| 5,028,551 A | 7/1991 | Dohjo et al. | |
| 5,040,875 A | 8/1991 | Noguchi | |
| 5,063,378 A | 11/1991 | Roach | |
| 5,070,379 A | 12/1991 | Nomoto et al. | |
| 5,071,779 A | 12/1991 | Tanaka et al. | |
| 5,124,769 A | 6/1992 | Tanaka et al. | |
| 5,141,885 A | 8/1992 | Yoshida et al. | |
| 5,147,826 A | 9/1992 | Liu et al. | |
| 5,153,702 A | 10/1992 | Aoyama et al. | |
| 5,157,470 A | 10/1992 | Matsuzaki et al. | |
| 5,165,075 A | 11/1992 | Hiroki et al. | |
| 5,198,379 A | 3/1993 | Adan | |
| 5,200,847 A | 4/1993 | Mawatari et al. | |
| 5,208,476 A | 5/1993 | Inoue | |
| 5,275,851 A | 1/1994 | Fonash et al. | |
| 5,294,811 A | 3/1994 | Aoyama et al. | |
| 5,306,651 A | 4/1994 | Masumo et al. | |
| 5,313,077 A | 5/1994 | Yamazaki | |
| 5,315,132 A | 5/1994 | Yamazaki | |
| 5,366,926 A | 11/1994 | Mei et al. | |
| 5,403,762 A | 4/1995 | Takemura | |
| 5,403,772 A | 4/1995 | Zhang et al. | |
| 5,420,048 A | 5/1995 | Kondo | |
| 5,441,905 A | 8/1995 | Wu | |
| 5,501,989 A | 3/1996 | Takayama et al. | |
| 5,530,265 A | 6/1996 | Takemura | |
| 5,543,636 A | 8/1996 | Yamazaki | |
| 5,569,936 A | 10/1996 | Zhang et al. | |
| 5,572,046 A | 11/1996 | Takemura | |
| 5,595,923 A | 1/1997 | Zhang et al. | |
| 5,648,662 A * | 7/1997 | Zhang et al. | 257/59 |
| 5,656,511 A | 8/1997 | Shindo | |
| 5,705,829 A | 1/1998 | Miyanga et al. | |
| 5,767,930 A | 6/1998 | Kobayashi et al. | |
| 5,811,328 A * | 9/1998 | Zhang et al. | 438/166 |
| 5,811,837 A | 9/1998 | Misawa et al. | |
| 5,821,565 A | 10/1998 | Matsuzaki et al. | |
| 5,834,071 A | 11/1998 | Lin | |
| 5,834,345 A | 11/1998 | Shimizu | |
| 5,849,611 A | 12/1998 | Yamazaki et al. | |
| 5,859,443 A | 1/1999 | Yamazaki et al. | |
| 5,888,839 A | 3/1999 | Ino et al. | |
| 5,943,593 A | 8/1999 | Noguchi et al. | |
| 6,124,155 A * | 9/2000 | Zhang et al. | 438/158 |
| 6,335,213 B1 * | 1/2002 | Zhang et al. | 438/150 |
| 2002/0127785 A1 | 9/2002 | Zhang et al. | |
| 2002/0130322 A1 | 9/2002 | Zhang et al. | |

FOREIGN PATENT DOCUMENTS

| | | |
|---|---|---|
| JP | 59-163871 | 9/1984 |
| JP | 60-245124 | 12/1985 |
| JP | 60-245172 | 12/1985 |
| JP | 61-263273 | 11/1986 |
| JP | 62-30379 | 2/1987 |
| JP | 62-104171 | 5/1987 |
| JP | 62-148928 | 7/1987 |
| JP | 62-171160 | 7/1987 |
| JP | 63-164 | 1/1988 |
| JP | 63-046776 | 2/1988 |
| JP | 63-86573 | 4/1988 |
| JP | 61-232483 | 4/1988 |
| JP | 63-086573 | 4/1988 |
| JP | 63-168052 | 7/1988 |
| JP | 63-237577 | 10/1988 |
| JP | 63-289965 | 11/1988 |
| JP | 64-45162 | 2/1989 |
| JP | 01-157520 | 6/1989 |
| JP | 01-155025 | 10/1989 |
| JP | 2-27320 | 1/1990 |
| JP | 02-008369 | 1/1990 |
| JP | 02-027320 | 1/1990 |
| JP | 2-33934 | 2/1990 |
| JP | 02-152251 | 6/1990 |
| JP | 2-177443 | 7/1990 |
| JP | 2-203567 | 8/1990 |
| JP | 2-208635 | 8/1990 |
| JP | 2-222545 | 9/1990 |
| JP | 2-223912 | 9/1990 |
| JP | 2-310932 | 12/1990 |
| JP | 3-91932 | 4/1991 |
| JP | 3-201538 | 9/1991 |
| JP | 4-360580 | 12/1992 |
| JP | 6-267978 | 9/1994 |
| JP | 6-267979 | 9/1994 |
| JP | 6-267988 | 9/1994 |
| JP | 6-275806 | 9/1994 |
| JP | 6-275807 | 9/1994 |

OTHER PUBLICATIONS

Wolf et al., Silicon Processing for the VLSI Era vol. 1: Process Technology, © 1986, pp. 179.

Wolf et al., Silicon Processing for the VLSI Era vol. 2: Process Integration, © 1990, pp. 260–273.

Inoue et al., "Low Temperature CMOS Self–Aligning Poly–Si TFTs and Circuit Scheme Utilizing New Ion Doping and Masking Technique", Seiko Epson Corporation, TFT Research Laboratory, Aug. 12, 1991, pp. 555–558.

Kawachi et al., "Large–Area Doping Process for Fabrication of Poly–Si Thin Film Transistors Using Bucket Ion Source and XeCl Excimer Laser Annealing", Japanese Journal of Applied Physics, vol. 29, No. 12, Dec. 1990, pp. L2370–2372.

Copy of an Official Action mailed Oct. 7, 2003 in U.S. application Ser. No. 10/140,176 filed May 8, 2002 and entitled *Semiconductor Device Having a Thin Film Transistor*, 7 pages including cover sheet.

* cited by examiner

LASER RADIATION

LASER RADIATION

ELECTRO-OPTICAL DEVICE AND THIN FILM TRANSISTOR AND METHOD FOR FORMING THE SAME

Divisional of prior application Ser. No.: 09/291,279 filed Apr. 14, 1999; now U.S. Pat. No. 6,335,213 which itself is a Division of Ser. No. 09/045,696 filed Mar. 23, 1998; now U.S. Pat. No. 6,124,155 which is a Division of Ser. No. 08/455,067 filed May 31, 1995, now U.S. Pat. No. 5,811,328; which is a Division of Ser. No. 08/260,751, filed Jun. 15, 1994 now U.S. Pat. No. 5,648,662; which is a Continuation of Ser. No. 07/895,029 filed Jun. 8, 1992 now abandend.

FIELD OF THE INVENTION

The present invention relates to an electro-optical device and a thin film transistor and a method for forming the same, in particular, to a method of fabricating polycrystalline, or microcrystalline, silicon thin film transistors.

BACKGROUND OF THE INVENTION

One method of obtaining a polycrystalline, or microcrystalline, silicon film is to irradiate a completed amorphous silicon film with laser radiation, for crystallizing the amorphous silicon. This method is generally well known. Laser-crystallized thin-film transistors fabricated by making use of this technique are superior to amorphous silicon thin-film transistors in electrical characteristics including field effect mobility and, therefore, these laser-crystallized thin-film transistors are used in peripheral circuit-activating circuits for active liquid-crystal displays, image sensors, and so forth.

The typical method of fabricating a laser-crystallized thin-film transistor is initiated by preparing an amorphous silicon film as a starting film. This starting film is irradiated with laser radiation to crystallize it. Subsequently, the film undergoes a series of manufacturing steps to process the device structure. The most striking feature of the conventional manufacturing process is to carry out the crystallization step as the initial or an intermediate step of the series of manufacturing steps described above.

Where thin-film transistors are fabricated by this manufacturing method, the following problems take place:

(1) Since the laser crystallization operation is performed as one step of the manufacturing process, the electrical characteristics of the thin-film transistor (TFT) cannot be evaluated until the device is completed. Also, it is difficult to control the characteristics.

(2) Since the laser crystallization operation is affected at the beginning of, or during, the fabrication of the TFT, is impossible to modify various electrical characteristics after the device structure is completed. Hence, the production yield of the whole circuit system is low.

SUMMARY OF THE INVENTION

It is an object of the present invention to provide a novel method of fabricating polycrystalline, or microcrystal-line, thin film transistors without incurring the foregoing problems.

In accordance with the present invention, in order to make it possible to crystallize a channel formation region into activate the Ohmic contact region of the source and drained by laser irradation after the device structure of a thin film transistor is completed, a part of the channel formation region and parts of the source and drain in the side of the channel formation region are exposed to incident laser radiation. Alternatively, the source and drain regions are located on the upstream side of the source and drain electrodes as viewed from the incident laser radiation, and parts of the source drain regions are in contact with the surface of the channel formation region on which the laser radiation impinges.

The activation of the source and drain regions is intended to impart energy to those regions which are doped with a dopant to improve the p- or n-type characteristics, thus activating the dopant where a group III or V dopant atom is implanted into an intrinsic amorphous silicon film by various methods. In this way, the electrical conductivity of the film is improved.

Other objects and features of the invention will appear in the course of the description thereof which follows.

DETAILED DESCRIPTION OF THE INVENTION

Figure 1A:
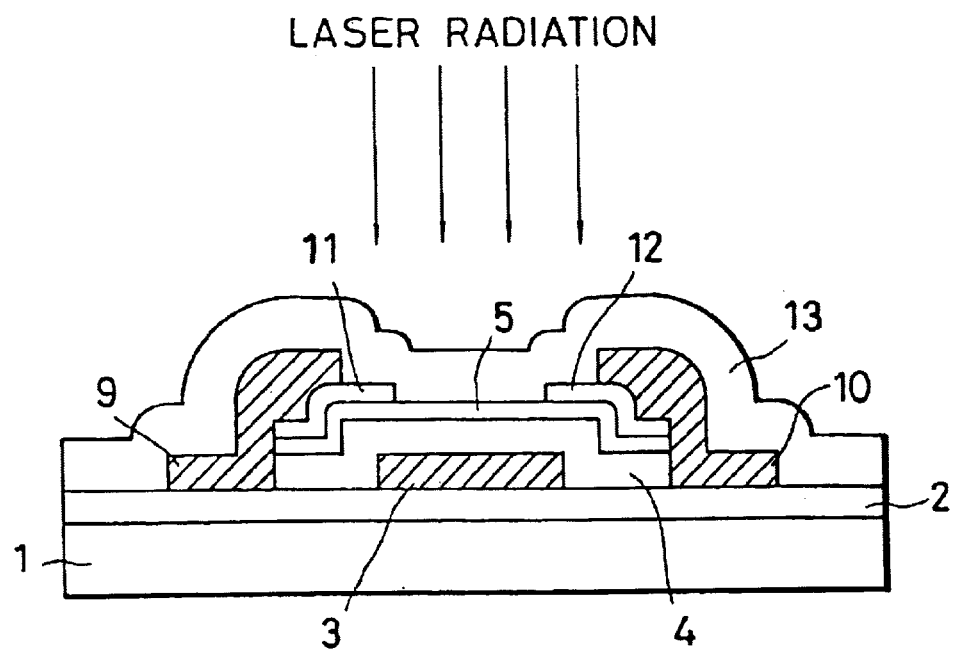
FIGS. 1, (a)–(d), are vertical cross sections of thin film transistors according to the invention.

A TFT (thin film transistor) according to the present invention is shown in FIGS. 1, (a)–(d). A doped amorphous silicon layer to become source and drain regions and an intrinsic amorphous silicon layer to become a channel formation region ban be irradiated with a laser radiation after completion of the device structure as shown in FIGS. 1 (a)–(d) to effectively perform crystallization and activation thereof. In FIG. 1(a), the distance between a source electrode 9 and a drain electrode 10 on a TFT island is set larger than the distance between a source region 11 and a drain region 12. This permits activation and crystallization of the source region 11, the drain region 12, and the channel formation region 5 by laser irradiation from above the substrate.

At this time, laser radiation having a sufficient energy is irradiated to crystallize even those portions of the intrinsic amorphous silicon layer 5 which are under the source and drain regions, the amorphous layer 5 becoming the channel formation region. In this manner, a channel exhibiting good characteristics can be obtained. Because the interface between a gate-insulating film 4 and the channel formation region is below the channel formation region, the incidence of the laser radiation does not deteriorate the interface characteristics. Hence, the Characteristics of the device are not impaired.

Ultraviolet radiation that is often used as a laser radiation can penetrate through silicon oxide ($SiO_2$) and so if a passivation film 13 consists of silicon oxide ($SiO_2$), then laser radiation can be illuminated from above the passivation film.

This can also prevent disturbance of the upper surface of the amorphous silicon film due to the laser irradiation. In particular, if the passivation film is made of silicon oxide, then this passivation film plays the same role as a cap layer which is generally used at time of crystallization of an amorphous silicon film by laser irradiation. This cap layer is formed on the amorphous silicon film irradiated with laser radiation and prevents disturbance of the upper surface of the film when it is irradiated with the laser radiation. Consequently, a laser-crystallized film of high quality can be obtained.

The wavelength of the laser radiation or the material of the glass substrate 1 is so selected that the laser radiation can penetrate through the glass substrate 1. A base film 2 is formed on the glass substrate to prevent intrusion of impurities from the substrate. It the material of the base film 2 and the material, e.g., silicon oxide, or the gate insulating film pass the laser radiation, then the gate electrode 3 is made narrower than the distance between the source and drain electrodes to permit irradiation of the laser radiation from below the substrate. As a result, the doped regions under the source and drain electrodes can be crystallized and activated. This further improves various characteristics. If the base layer and the gate insulating film are made of silicon oxide, then they act as cap layers and prevent disturbance of the lower surface of the film.

Figure 1B:
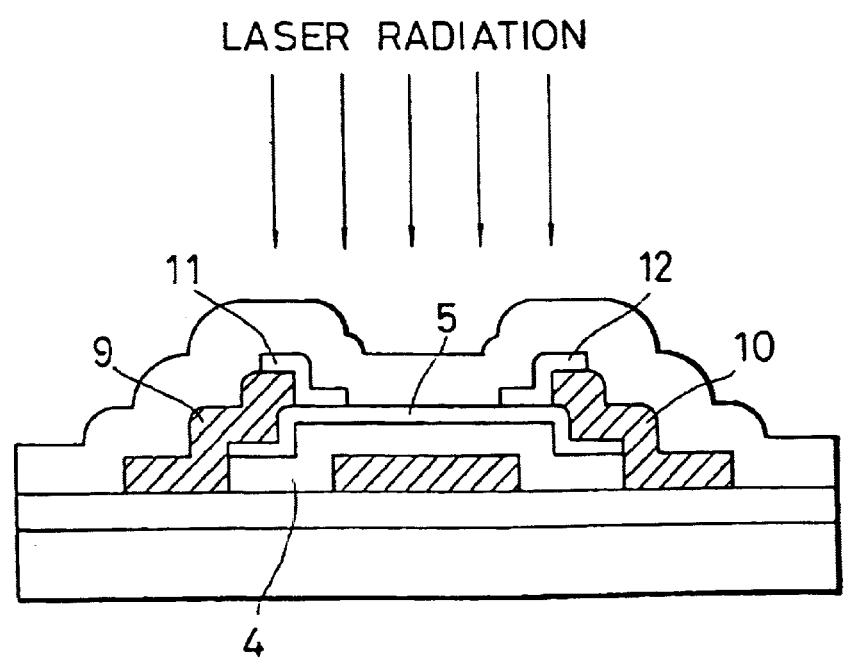

FIG. 1(b) shows an improvement over the structure shown in FIG. 1(a). In this structure of FIG. 1(b), the source and drain regions are more effectively activated by laser irradiation.

In FIG. 1(b), the source region 11 and the drain region 12 which are doped are located on the source electrode 9 and the drain electrode 10, respectively, and are in contact with the upper surface of an intrinsic semiconductor layer to become a channel formation region 5. Laser irradiation to the source and drain regions only from above them suffices. Therefore, as compared with the structure shown in FIG. 1(a), various characteristics can be improved more greatly and controlled over wider ranges. In the same way as in the structure of FIG. 1(a), irradiation of laser radiation having a sufficient energy crystallizes the portions of an intrinsic amorphous silicon layer 5 which are below the source and drain regions, the silicon layer 5 becoming a channel formation region. In consequence, a channel having good characteristics can be derived. Since the interface between the gate insulating film 4 and the channel formation region is below the channel formation region, the incidence of the laser radiation does not deteriorate the interface characteristics. Consequently, the characteristics of the device are not deteriorated. If the passivation film consists of silicon oxide, then it serves as a cap layer on irradiation of the laser radiation. The cap layer prevents disturbance of the upper surfaces of the doped amorphous silicon film and of the intrinsic amorphous silicon film due to the laser irradiation. The doped amorphous silicon film forms the source and drain regions. The intrinsic amorphous silicon film is the channel formation region.

Structures shown in FIGS. 1, (c) and (d), are totally inverted versions of the structures of FIGS. 1, (a) and (b), respectively. The wavelength of the laser radiation or the material of the glass substrate is so selected that the laser radiation con penetrate the glass substrate. The laser radiation is irradiated mainly from below the substrate to crystallize and activate the source and drain regions as well as the channel formation region.

Figure 1C:
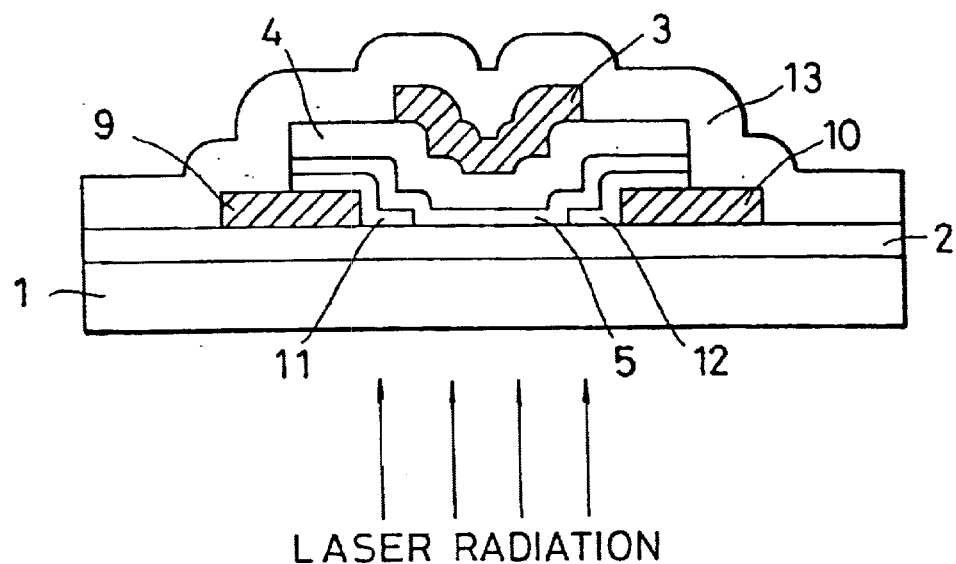

The structure of FIG. 1(c) is the totally inverted version of the structure of FIG. 1(a). The distance between the source electrode 9 and the drain electrode 10 is set larger than the distance between the source region 11 and the drain region 12, in the same way as in the structure of FIG. 1(a). Laser radiation is illuminated from below the substrate to activate and crystallize the source and drain regions and the channel formation region 5.

At this time, laser radiation having a sufficient energy is illuminated to crystallize even those portions of the intrinsic amorphous silicon layer 5 which are over the source and drain regions, the amorphous silicon layer 5 becoming a channel formation region. Thus, a channel having good characteristics can be obtained. Since the interface between the gate insulating film and the channel formation region is located above the channel formation region, the interface characteristics are not deteriorated by the incidence of the-laser radiation from below the substrate. In consequence, the characteristics of the device. are not deteriorated.

If the base film 2 that is formed on the glass substrate 1 to prevent intrusion of impurities from the glass substrate is made of silicon oxide, then this film acts as a cap layer and prevents disturbance of the lower surfaces of the amorphous silicon films some of which are source and drain regions, the remaining amorphous silicon film being a channel formation film. If the materials of the passivation film 13 and of the gate insulating film 4 pass the laser radiation such as silicon oxide, then the gate electrode 3 is made narrower than the distance between the source and drain electrodes. Thus, the laser radiation is irradiated from above the substrate to crystallize and activate the doped regions located over the source and drain electrodes. Hence, various characteristics can be improved more greatly. At this time, if the passivation film and the gate insulating film are made of silicon oxide, they serve as cap layers and can prevent disturbance of the upper surfaces of the amorphous silicon films due to the laser irradiation.

Figure 1D:
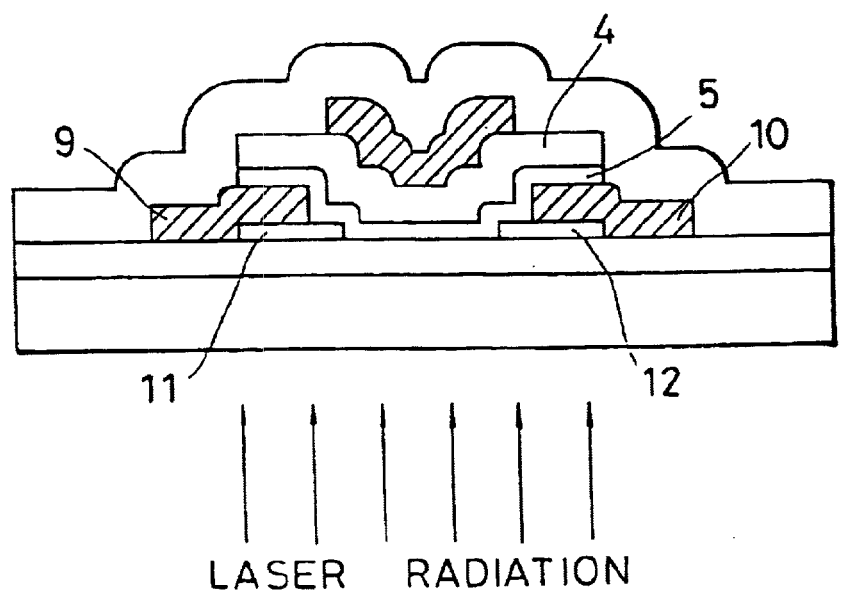

FIG. 1(d) shows an improvement over the structure shown in FIG. 1(c). In this structure of FIG. 1(d), the source and drain regions are more effectively activated by laser irradiation.

In FIG. 1(d), the source region 11 and the drain region 12 which are doped are located under the source electrode 9 and the drain electrode 10, respectively, and are in contact with the undersides of opposite lateral sides of a channel formation region 5. Laser irradiation to the source and drain regions only from below them suffices. Therefore, as compared with the structure shown in FIG. 1(c), various characteristics can be improved more greatly and controlled over wider ranges. In the same way as in the structure of FIG. 1(c), irradiation of laser radiation having a sufficient energy crystallizes the portions of an intrinsic amorphous silicon layer which are above the source and drain regions, the silicon layer becoming a channel formation region. In consequence, a channel having good characteristics can be derived.

Since the interface between the gate insulating film 4 and the channel formation region is above the channel formation region, the incidence of the laser radiation does not deteriorate the interface characteristics. Consequently, the characteristics of the device do not deteriorate. If the base film consists of siliconoxide, then it serves as a cap layer on irradiation of the laser radiation. The cap layer prevents disturbance of the lower surfaces of the doped amorphous silicon film and of the intrinsic amorphous silicon film due to the laser irradiation. The doped amorphous silicon film forms the source and drain regions. The intrinsic amorphous silicon film is the channel formation region.

In the structure described above, the source and drain regions and the channel formation region can be activated and crystallized by laser irradiation after the device structure of the amorphous silicon thin film transistor has been completed.

As described thus far, laser radiation is not irradiated before or during processing of the device structure. Rather, the device is processed during the fabrication of the amorphous silicon TFTs. The laser radiation is directed to the source, drain regions and to the channel formation region of desired one or more of the amorphous silicon TFTs after the device structure is completed (i.e., the doped semiconductor layers, the intrinsic semiconductor layer to be a channel located between source and drain regions adjacent to a gate electrode with a gate insulating film therebetween, and the gate insulating film are formed, the source and drain regions are formed, the source and drain and gate electrodes are formed, and the protective film (passivation film) are formed) or after a process including formation of conductive interconnects is completed. In this way, the channel formation region of the thin film transistor is activated, and the source and drain regions are activated and crystallized. At this time, if the electrodes and the conductive interconnects have been completed, then the laser irradiation can be continued while monitoring electrical characteristics of any desired amorphous silicon TFT on the substrate on a real-time basis until an optimum value is reached. It is also possible to fabricate thin film transistors having desired characteristics by measuring the electrical characteristics subsequent to laser irradiation and repeating this series of steps.

In this way, plural amorphous silicon TFTs are fabricated by the same manufacturing method on the same substrate. After the device structure is completed, desired one or more of the amorphous silicon TFTs can be made to have desired electrical characteristics. That is, TFTs having different electrical characteristics on the same substrate can be manufactured by irradiation of laser radiation after the device structure is completed.

After plural amorphous silicon TFTs are fabricated by the same manufacturing process on the same substrate and the device structure is completed, desired one or more of the TFTs are crystallized by laser irradiation. In this manner, poly-silicon TFTs are fabricated. As a result, a system comprising the substrate on which amorphous silicon TFTs and polysilicon TFTs are fabricated can be manufactured without relying on different manufacturing processes.

The laser irradiation operation is carried out in a quite short time and, therefore, the polysilicon TFTS can be manufactured at low temperatures, i.e., between room temperature and 400° C., without substantially elevating the substrate temperature. This permits a polysilicon TFT system having a large area to be fabricated economically without using an expensive glass such as quartz glass.

Examples of the invention are given below.

EXAMPLE 1

Figure 2:
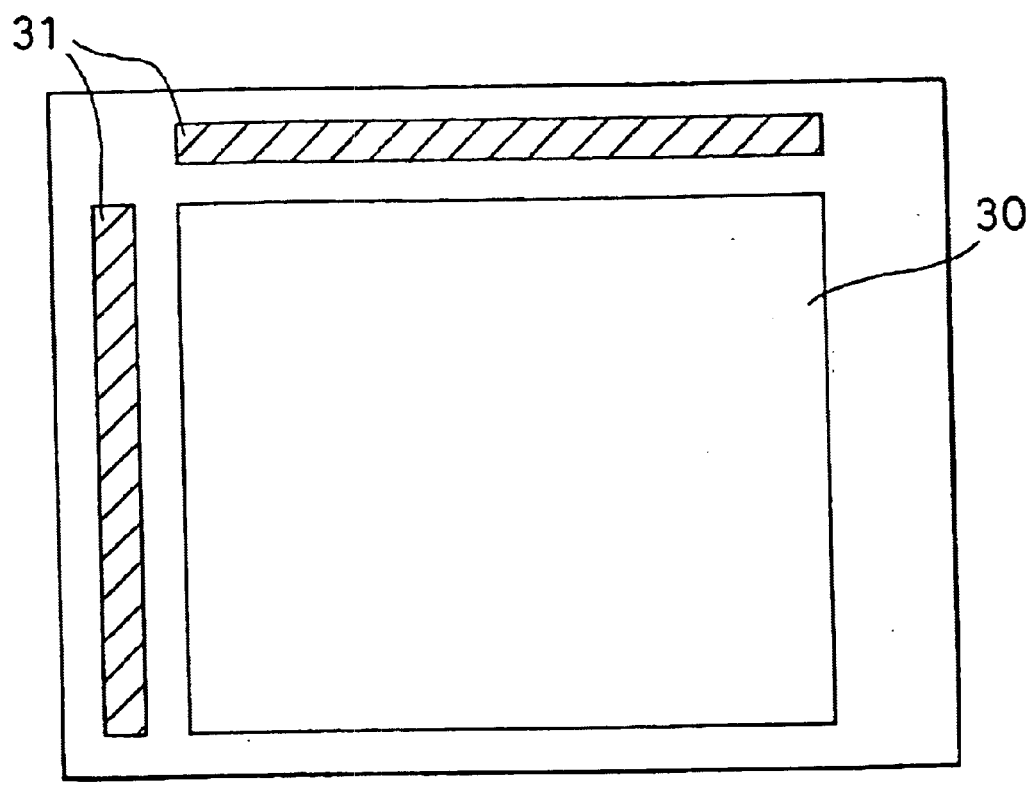
FIG. 2 is a plan view of a liquid-crystal display using thin film transistors according to the invention.

An integrated LCD (liquid-crystal display) system consisted of amorphous silicon TFTs and polysilicon TFTs. As shown in FIG. 2, this integrated LCD system needed TFTs 30 for activating pixels arranged in rows and columns, as well as TFTs 31 for peripheral circuits. These two kinds of TPTs were required to operate at totally different speeds. A mobility of about 1 cm$^2$/V·s suffices for the TFTs for activating the pixels. On the other hand, the TFTs for the peripheral circuits must operate at a high speed on the order of several megahertz. Preferably, therefore, the TFTs for the activation of the pixels are made of amorphous silicon, while the TFTs for the peripheral circuits are made of polysilicon. In this example, the amorphous silicon TFTs and the polysilicon TFTs could be manufactured simultaneously by the same process for fabricating the device structure of the system shown in FIG. 2.

FIGS. 3, (A)–(H), schematically illustrate a method of fabricating a TFT. In this example, the structure of FIG. 1(a), or the TFT of the inverse staggered structure, was used. Of course, other structure may be employed. In FIG. 3(A), a sheet of glass 1 was made of an inexpensive glass, i.e., excluding quartz glass, and withstood thermal treatment below 700° C., e.g., about at 600° C. Silicon oxide (SiO$_2$) was deposited as a base film 2 on the glass sheet 1 up to a thickness of 1000 to 3000 Å by RF (high frequency) sputtering, using a magnetron. In the present example, the thickness of the base film 2 was 2000 Å. The film was formed within an ambient of 100% oxygen. The temperature was 150° C. during the formation of the film. The output of the magnetron was 400 to 800 W. The pressure was 0.5 Pa. A target consisting of quartz or a single crystal of silicon was used. The deposition rate was 30 to 100 Å/min.

A chromium (Cr) layer 3 which would become a gate electrode was formed on the base film 2 by a well-known sputtering method. The thickness of the film was 800 to 1000 Å. In the present example, the thickness was 1000 Å. This film was patterned with a first photomask P1, resulting in a structure shown in FIG. 3(B). The gate electrode may be made of tantalum (Ta). Where the gate electrode was made of aluminum (Al), the film might be patterned with the first photomask P1 and then the surface might be anodized (anodic oxidized).

A film of silicon nitride (SiN$_x$) was formed as a gate-insulating film 4 on the chromium layer 3 by PCVD. The thickness of the film was 1000 to 5000 Å. In the present example, the thickness was 3000 Å. The raw material gas consisted of one part of silane (SiH$_4$) and three parts of ammonia gas (NH$_3$). The film was formed at a temperature of 250 to 350° C. In the present example, the temperature was 260° C. The RF frequency was 13.56 MHz. The RF output power was 80 W. The pressure was 0.05 torr. The deposition rate was 80 Å/min.

An intrinsic amorphous silicon film 5 was formed on the gate-insulating film 4 by PCVD. The thickness of the film 5 was 200 to 1000 Å. In the present example, the thickness was 700 Å. Silane (SiH$_4$) was used as the raw material gas. The film was formed at a temperature of 150 to 300° C. In the present example, the temperature was 200° C. The RF frequency was 13.56 MHz. The RF output power was 35 W. The pressure was 0.5 torr. The deposition rate was 60 Å/min.

A doped amorphous silicon layer 6 was formed on the intrinsic amorphous silicon film 5 by PCVD. In the present example, the layer 6 was an n$^+$-type amorphous silicon layer. The thickness of the layer 6 was 300 to 500 Å. In the present example, the thickness was 500 Å. Silane was used as the raw material gas. Phosphine (PH$_3$) which accounted for 1% of the silane was added to implant phosphorus as an n-type dopant. The film was formed at a temperature of 150 to 300° C. In the present example, the temperature was 200° C. The RF frequency was 13.56 MHz. The RF output power was 40 W. The pressure was 0.5 torr. The deposition rate was 60 Å/min.

Figure 3A:
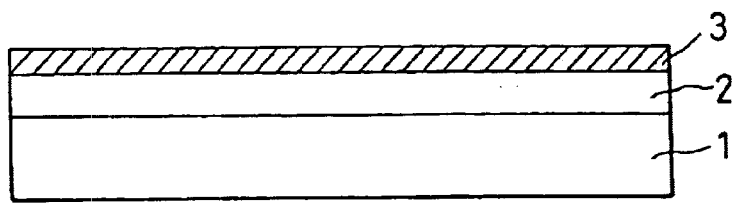
FIGS. 3, (A)–(H), are cross-sectional views illustrating steps successively performed to fabricate a thin film transistor according to the invention.
Figure 3B:
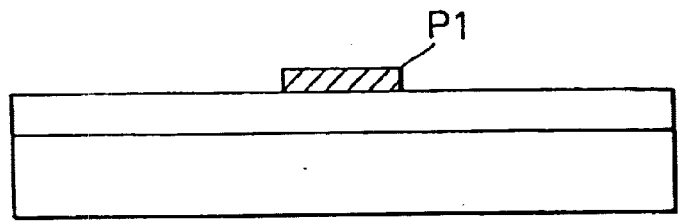
Figure 3C:
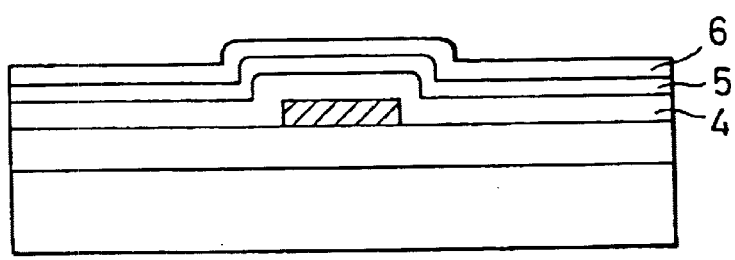
Figure 3D:
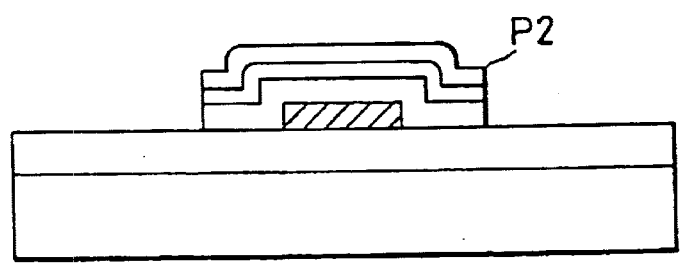

The gate insulating film 4, the intrinsic amorphous silicon layer 5, and the n$^+$-type amorphous silicon layer 6 were M formed in this way, thus resulting in a laminate shown in FIG. 3(C). These layers were all created by PCVD. Therefore, it is effective to form them in succession in a multi-chamber system. Other methods such as low-pressure CVD, sputtering, photo-assisted CVD may also be adopted. Subsequently, a dry etching process was performed, using a second photomask P2, to form a TFT island as shown in FIG. 3(D).

Figure 3E:
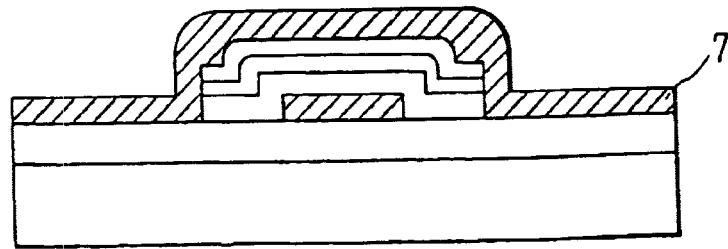
Figure 3F:
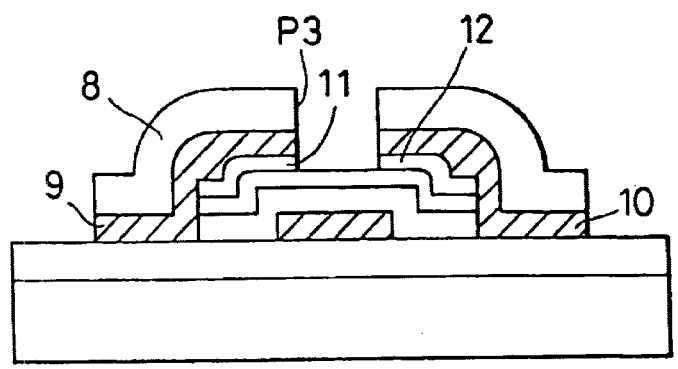

Then, a chromium layer 7 which would become source and drain electrodes was formed by sputtering. The resulting laminate is shown in FIG. 3(E). The thickness was 500 to 1000 Å. In the present example, the thickness was 800 Å. This layer was patterned, using a third photomask P3. At this time, the n$^+$-type amorphous silicon layer was patterned by dry etching without peeling off resist 8. Thus, a channel formation region, a source electrode 9, a drain electrode 10, a source region 11, and a drain region 12 were formed, resulting in a laminate shown in FIG. 3(F).

A wet etching process was carried out without peeling off the resist to perform an overetching process which made the distance between the source and drain electrodes larger than the distance between the source and drain regions. This made it possible to activate and crystallize the source and drain regions by laser irradiation from above the laminate. Thereafter, the resist was peeled off, producing a laminate shown in FIG. 3(G).

Figure 3G:
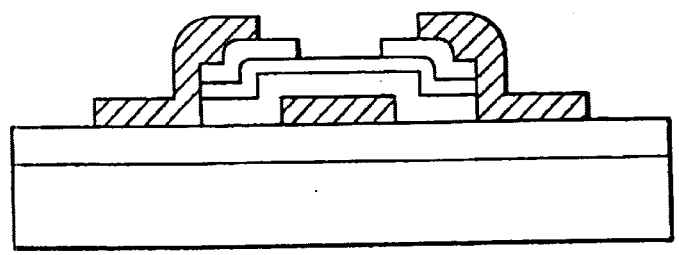
Figure 3H:
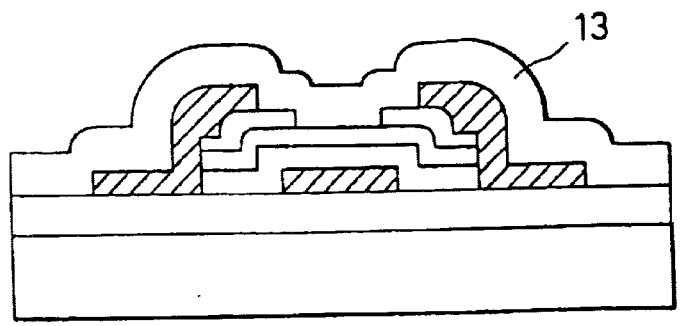

As shown in FIG. 3(H), silicon oxide ($Sio_2$) was deposited as a passivation film on the laminate shown in FIG. 3(G) by the aforementioned RF sputtering. The thickness of this film was 1000 to 3000 Å. In the present example, the thickness was 2000 Å. FCVD and other methods may also be used. In this way, the device structure of the TFT was completed.

Thereafter, conductive interconnects were formed. A measuring instrument was connected. Laser radiation was illuminated from above the device while monitoring the electrical characteristics. HP-4142B was employed as the measuring instrument. An excimer laser was used as the laser. In this example, a KrF excimer laser producing laser radiation of wavelength 248 nm was used. Ultraviolet radiation at this wavelength could penetrate through the passivation film formed at the top of the TFT. The energy E was 200 to 350 mJ/cm$^2$. The number of the shot laser pulses was 1 to 50. The temperature Ts of the substrate was from room temperature to 400° C. during the illumination.

In this way, either the channel formation region or the source and drain regions or all of them were illuminated with laser radiation while monitoring the electrical characteristics on the measuring instrument. As a result, the region or regions were crystallized and activated. TFTs 30 for activating the matrix of pixels shown in FIG. 2 exhibited desired characteristics. These TFTs are huge in number, e.g., 640× 400=256,000. It is necessary that these TFTs have exactly the same characteristics. Hence, it has been very difficult to increase the production yield. The novel method could greatly reduce defective TFTs whose characteristics deviate greatly from intended characteristics. Consequently, the production yield could be enhanced greatly.

TFTs 31 (FIG. 2) for peripheral circuits were sufficiently illuminated with laser radiation. The result is that the characteristics were improved greatly. Before the laser illumination, the field effect mobility $\mu 1$ was 0.5 to 0.8 cm$^2$/V·s and the threshold voltage $V_{th1}$ was 10 to 20 V. After the laser illumination, the field effect mobility $\mu 2$ was 10 to 100 cm$^2$/V·s and the threshold voltage $V_{th2}$ was 5 to 7 V. In this way, the characteristics were improved greatly. The TFTs could operate at a sufficiently large velocity to activate the peripheral circuits of a liquid crystal display device. The channel formation region made of an amorphous silicon film was crystallized and became a polysilicon film having a high carrier mobility. The TFTs had satisfactory characteristics as polysilicon TFTS.

Then, ITO (indium tin oxide) was sputtered on the substrate up to a thickness of 0.1$\mu$m. Pixel electrodes were created by patterning using a photomask. Pixel electrodes were then connected with the thin film transistors. This ITO film was created at a temperature between room temperature and 150° C. followed by an anneal within oxygen ambient or within the atmosphere at a temperature of 200 to 400° C. If the pixel electrodes are not deteriorated by the laser radiation, then the TFTs may be illuminated with laser radiation after the pixel electrodes are completed.

A polyimide precursor was printed on the substrate by an offset method. The laminate was sintered within a non-oxidizing ambient of, for example, nitrogen at 350° C. for 1 hour. Then, the polyimide surface was changed in quality by a well-known rubbing method. A means of orienting the liquid-crystal molecules in a given direction at least at the beginning was produced thereby. In this manner, one substrate of a liquid-crystal display was obtained.

Figure 6:
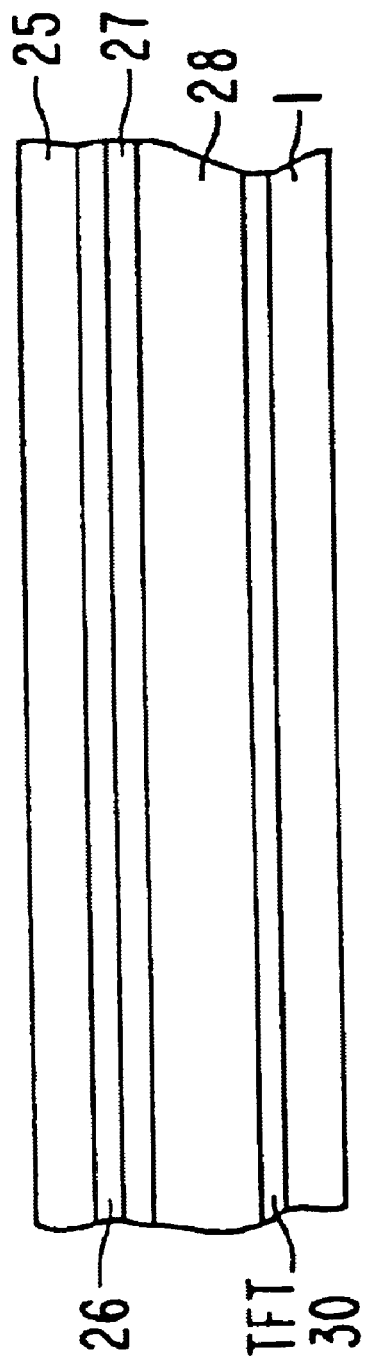
FIG. 6 is a view showing the assembly of a liquid-crystal display according to the present invention.

FIG. 6 is a view showing the assembly of a liquid-crystal display according to the present invention.

The other substrate 25 was created by sputtering ITO over the whole surface of one side of the glass substrate up to a thickness of 1$\mu$m and patterning the ITO into a counter electrode 26, using a photomask. The ITO film was formed at a temperature between room temperature and 150° C., and then annealed within an oxygen or atmospheric ambient at 200 to 300° C. Consequently, a second substrate was obtained.

A polyimide precursor was printed on the substrate by an offset method. The laminate was sintered at 350° C. for 1 hour within a non-oxidizing ambient of, for example, nitrogen. Then, the polyimide surface 27 was changed in quality by a well-known rubbing method. A means of orienting the liquid-crystal molecules in a given direction at least at the beginning was produced thereby.

Then, a nematic-liquid crystal 28 was sandwiched between the aforementioned two substrates to form an electro-optical modulating layer between the two substrates 1 and 25. Thereby, the counter electrode 26 is provided on the electro-optical modulating layer. External leads were bonded. A polarizing plate was stuck to the outer surface, thus producing a transmission-type liquid-crystal display. The derived liquid-crystal display was comparable to a liquid-crystal display in which TFTs for activating a matrix of pixels are fabricated independent of peripheral driving circuits.

As described thus far, in order to crystallize and activate the channel formation region, the source and drain regions by laser irradiation after the completion of the device structure, it is necessary that the incident side, or the passivation film at the top of the laminate, pass ultraviolet radiation. In the channel formation region, it is the interface with the gate insulating film which operates as a channel in practice. Therefore, the intrinsic amorphous silicon layer which becomes the channel formation region must be crystallized sufficiently. For this purpose, this amorphous silicon layer should be made as thin as possible.

In this way, the various characteristics can be controlled and polysilicon TFTs can be fabricated by irradiating the amorphous silicon TFTs with laser radiation after the device structure is completed. Also, the amorphous silicon TFTs and the polysilicon TFTs can be manufactured separately on the same substrate during the same process for fabricating the same device structure. Furthermore, a circuit system having numerous polysilicon TFTs can be fabricated at a low temperature between room temperature and 400° C., The system can be manufactured economically without using an expensive glass such as quartz glass.

EXAMPLE 2

A polysilicon TFT liquid-crystal display having redundant circuit configurations was fabricated in accordance with the present invention. It is very difficult to completely operate all TFTs of a circuit system using numerous polysilicon TFTs such as a polysilicon TFT liquid-crystal display. In reality, some form of redundant configuration is often adopted to improve the production yield. One kind of redundant configuration for amorphous silicon TFTs for activating the matrix of pixels of an amorphous silicon TFT liquid-crystal display comprises two TFTs connected in parallel. These two TFTs are operated simultaneously. If one of them does not operate for some cause or other, the other operates. This improves the production yield. However, the electric current flowing through one polysilicon TFT when it is conducting is as large as about 0.1 mA, which is approximately 100 times as high as the current of about $1 \mu A$ flowing through a conducting amorphous silicon TFT. If twice as many as TFTs are operated for redundancy, then it follows that an exorbitant amount of current is wasted. Therefore, it is desired that each one pixel be activated by one TFT.

Another form of redundant configuration used in a laser-crystallized polysilicon TFT circuit system comprises two identical polysilicon TFT circuits which can be connected in parallel. One circuit is operated at first. When this circuit ceases to operate normally, or if a malfunction is discovered at the time of an operation check, the operated circuit is switched to the other. In this case, both circuits must be fabricated from laser-crystallized polysilicon TFTs. Hence, the time of the laser irradiation operation is doubled. Also, the energy consumed is doubled. The time taken to complete the product is prolonged. In addition, the cost is increased.

Figure 4:
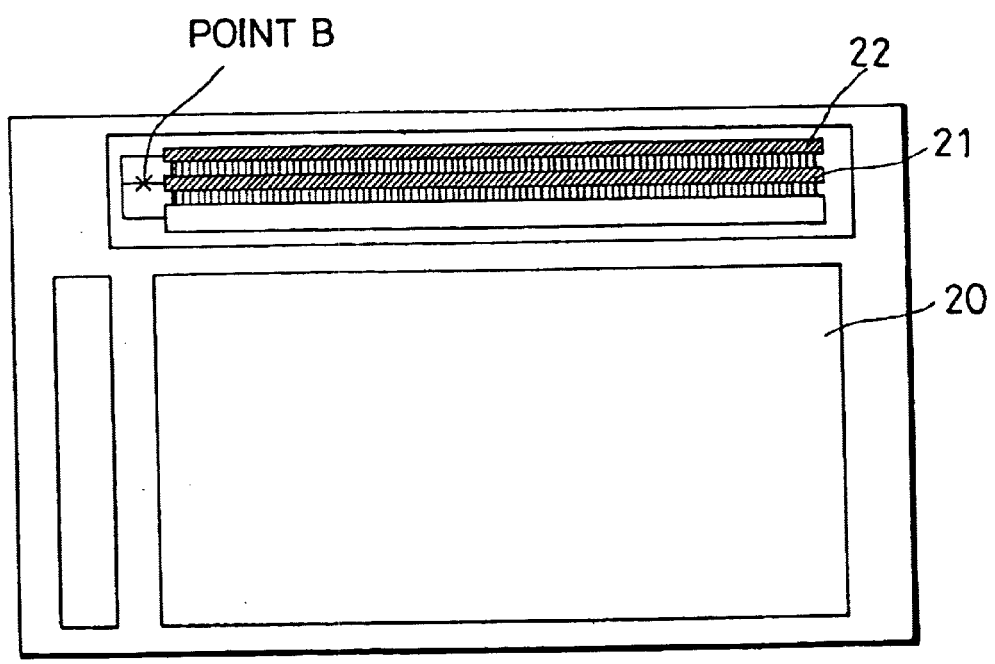
FIG. 4 is a plan view of a polysilicon TFT-activated liquid-crystal display having redundant configurations according to the invention.
Figure 5:
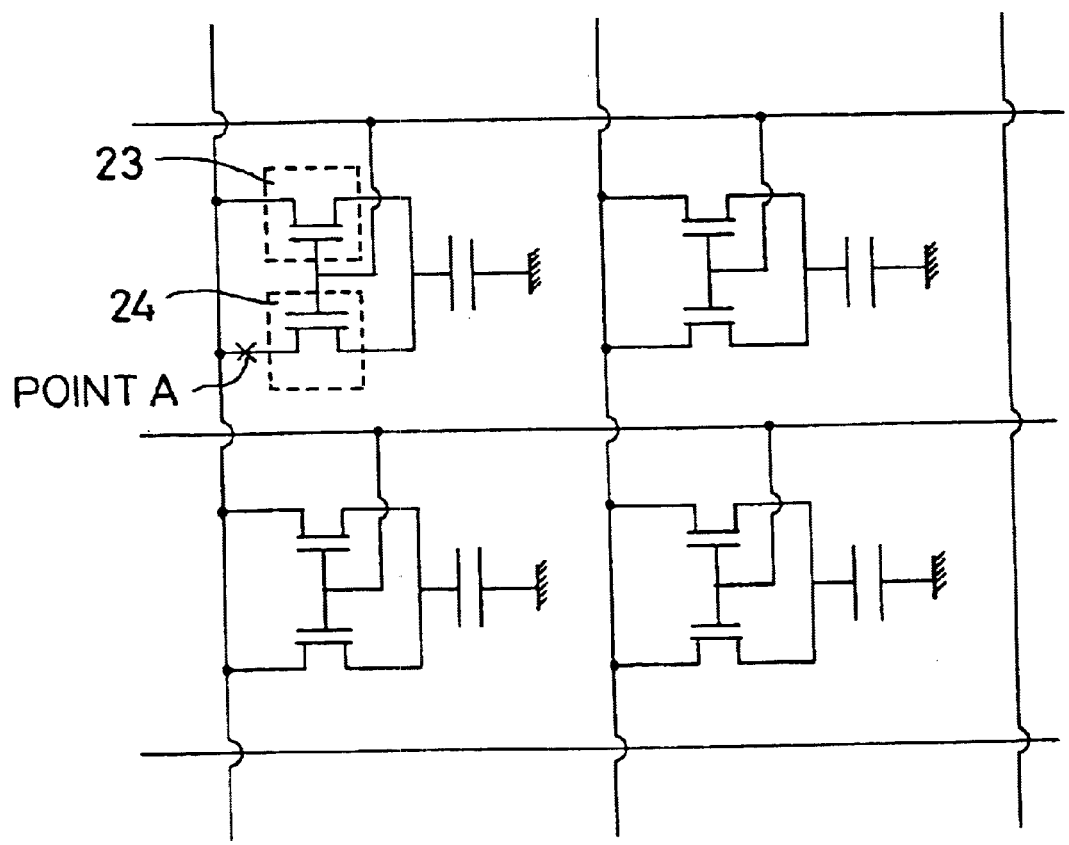
FIG. 5 is a circuit diagram of the redundant configurations of the liquid-crystal display shown in FIG. 4.

These problems are solved by a novel method described now. FIG. 4 shows a polysilicon TFT liquid-crystal display having redundant configurations according to the invention. As shown in FIGS. 4 and 5, in this liquid-crystal display, all TFTs 20 for activating pixels arranged in rows and columns and a shift register 21 in a peripheral circuit have redundant configurations. Each TFT configuration for activating a pixel has two identical TFTS. The shift register has two identical circuits.

First, all TFTS having redundant configuration were manufactured. Each TFT assumed the structure shown in FIGS. 1, (a)–(d). After the device structure was completed, it was irradiated with laser radiation to change the TFTs into polysilicon TFTS. The TETs were manufactured in the sequence shown in FIGS. 3, (A)–(H), as described in connection with Example 1. A passivation film was formed. The process proceeded to the condition in which the pixel electrodes were not yet formed, i.e., to the step of FIG. 3(H).

FIG. 5 shows the arrangement of the TFTs for activating pixels arranged in rows and columns. These TFTs were amorphous silicon TFTs. Two TFTs were connected in parallel. Each pair of TFTs were connected with every pixel electrode. One of these two TFTs, TFT 23 in this example, was irradiated with laser radiation to make the TFT a polysilicon TFT. A measuring instrument was connected, and the operation was checked. If no trouble was found, then the operator went to the next step. Since the redundant TFT 24 was an amorphous silicon TFT, the working current was two orders of magnitude less than the working current through a polysilicon TFT. Therefore, the effects of redundant TFT could be substantially neglected. Furthermore, parallel operation does not occur, because the threshold voltage for a polysilicon TFT was 0 to about 10 V, whereas the threshold voltage for an amorphous silicon TFT was about 10 to 20 V. In this manner, only the laser-crystallized polysilicon TFT operated.

If any TFT does not operate normally, the redundant amorphous silicon TFT (24 in this example) forming a pair with the malfunctioning TFT is irradiated with laser radiation to make the amorphous silicon TFT a polysilicon TFT. If necessary, the interconnect to the non-redundant TFT, or point A in this example, is broken by the laser irradiation. In this manner, the operated TFT can be easily switched to the redundant TFT.

In this structure, if it is not necessary to switch the operated TFT to the redundant TFT, the polysilicon TFT activating one pixel is substantially one, though the two TFTs provide a redundant configuration. The electric power consumed can be halved compared with the case in which two polysilicon TFTs are connected in parallel to form a redundant configuration. Also, the operated TFT can be switched to the redundant TFT by one or more shots of laser radiation. In consequence, a very simple and efficient method has been realized.

The redundant circuit of the shift register also comprises two same circuits connected in parallel. After the condition shown in FIG. 3(H), the TFTs are fabricated as amorphous silicon TFTs until electrodes are connected. Later connection or switching using a connector or the like may also be made. All the TFTS in one circuit, 21 in this example, are crystallized by laser irradiation. A measuring instrument is connected to check the operation. If they operate normally, then the operator goes to the next step.

Where both circuits are connected in parallel, the TFT in the redundant circuit is an amorphous silicon TFT and, therefore, the working current is about two orders of magnitude smaller than the working current through a polysilicon TFT. Hence, the effects of the TFT in the redundant circuit are substantially negligible. Furthermore, parallel operation does not occur, because the threshold voltage for a polysilicon TFT is 0 to about 10 V, whereas the threshold voltage for an amorphous silicon TFT is about 10 to 20 V. In this manner, only the laser-crystallized polysilicon TFT operates.

If the circuit does not operate normally, the amorphous silicon TFT in the redundant circuit 22 is irradiated with laser radiation to change the amorphous silicon TFT into a polysilicon TFT. If necessary, the interconnect (point B in this example) to the non-redundant circuit is broken by laser radiation. In this way, the operated circuit is easily switched to the redundant circuit. Of course, the connection or switching may be made by a connector or the like.

Consequently, crystallization by laser irradiation is not needed unless the necessity of switching to the redundant circuit arises. The time for which laser radiation is irradiated is halved compared with the case in which all TFTs are irradiated with laser radiation at the beginning of, or during, the process for manufacturing them. As such, wasteful consumption of energy is avoided. Also, the process time is shortened. A reduction in the cost is accomplished. Furthermore, energy is saved. In addition, the operation for switching the operated TFT to the redundant TFT can be quite easily performed without involving complex wiring operations.

Moreover, this method can be applied to a device which malfunctions in use, as well as to a device that is being W manufactured. The performance of the used device can be recovered similarly. In this manner, the novel structure realizes an advantageous redundant configuration in a circuit comprising a polysilicon TFT. That is, this redundant configuration offers a reduction in the electric power consumed, a reduction in the manufacturing time, a reduction in the cost, and energy saving.

The novel manufacturing method yields the following advantages. After the device structure is completed, laser radiation is illuminated while monitoring the electrical characteristics. This makes it easy to control the optimum parameter of thin film transistors forming a circuit system. In the case of a TFT liquid-crystal display or the like needing a quite large number of TFTs, they are required to have uniform characteristics. If the characteristics of the TFTs vary, the variations can be corrected by the novel method. Hence, the quality and the production yield can be improved greatly. Additionally, the quality and the production yield can be enhanced simultaneously without the need to subject the device structure to any complex step.

The present invention permits the various electrical characteristics such as the mobility of the thin film transistors on the same substrate to be controlled at will. Also, a mixed system comprising amorphous silicon TFTs and polysilicon TETs can be fabricated by crystallizing only requisite TFTs.

Since the laser radiation is irradiated only for a quite short time, the substrate temperature is hardly elevated and so polysilicon TFT can be manufactured at low temperatures between room temperature and 400° C. In consequence, a polysilicon TFT system having a large area can be fabricated economically without using an expensive glass such as quartz glass.

The novel TET structures and general TFT structures are manufactured on the same substrate, making use of amorphous silicon. Laser radiation is directed to the TFTs of the novel structure. Thus, a mixed system comprising amorphous silicon TFTs and polysilicon TFTs can be realized.

As described thus far, the novel method of manufacturing an thin film transistors yields numerous advantages. In this way, them novel method is industrially advantageous.

What is claimed is:

1. A method of manufacturing a semiconductor device comprising the steps of:

forming a gate electrode on an insulating surface by using a first mask;

forming an insulating film comprising silicon nitride;

forming a first semiconductor film comprising amorphous silicon over said gate electrode with said insulating film interposed therebetween wherein said insulating film comprising silicon nitride contacts said first semiconductor film;

forming a second semiconductor film on said first semiconductor film;

patterning said first and second semiconductor films by using a second mask;

forming a conductive layer on the patterned second semiconductor film;

patterning the conductive layer to form source and drain electrodes by using a third mask wherein a portion of the patterned second semiconductor film is exposed between said source and drain electrodes;

etching the exposed portion of the second semiconductor film to form source and drain regions and to expose a portion of said first semiconductor film between said source and drain regions;

forming a passivation film over said first semiconductor film, said source and drain regions, and said source and drain electrodes wherein said passivation film contacts the exposed portion of the first semiconductor film; and forming a pixel electrode over the passivation film.

2. A method according to claim 1 wherein said gate electrode comprises a material selected from the group consisting of chromium, aluminum and tantalum.

3. A method according to claim 1 wherein said first semiconductor film comprises intrinsic amorphous silicon.

4. A method according to claim 1 wherein said second semiconductor film has an n-type conductivity.

5. A method according to claim 1 wherein said conductive layer comprises chromium.

6. A method according to claim 1 wherein said insulating film is 1000 to 5000Å thick.

7. A method of manufacturing a semiconductor device comprising the steps of:

forming a gate electrode on an insulating surface by using a first mask;

forming an insulating film comprising silicon nitride;

forming a first semiconductor film comprising amorphous silicon over said gate electrode with said insulating film interposed therebetween wherein said insulating film comprising silicon nitride contacts said first semiconductor film;

forming a second semiconductor film on said first semiconductor film;

patterning said first and second semiconductor films by using a second mask;

forming a conductive layer on the patterned second semiconductor film;

patterning the conductive layer to form source and drain electrodes by using a third mask wherein a portion of the patterned second semiconductor film is exposed between said source and drain electrodes;

etching the exposed portion of the patterned second semiconductor film to form source and drain regions by using said source and drain electrodes as a mask and to expose a portion of said first semiconductor film between said source and drain regions;

forming a passivation film over said first semiconductor film, said source and drain regions, and said source and drain electrodes wherein said passivation film contacts the exposed portion of the first semiconductor film; and forming a pixel electrode over the passivation film.

8. A method according to claim 7 wherein said gate electrode comprises a materials elected from the group consisting of chromium, aluminum and tantalum.

9. A method according to claim 7 wherein said first semiconductor film comprises intrinsic amorphous silicon.

10. A method according to claim 7 wherein said second semiconductor film has an n-type conductivity.

11. A method according to claim 7 wherein said conductive layer comprises chromium.

12. A method according to claim 7 wherein said insulating film is 1000 to 1500Å thick.

13. A method of manufacturing a semiconductor device comprising the steps of:

forming a gate electrode on an insulating surface by using a first mask;

forming an insulating film comprising silicon nitride;

forming a first semiconductor film comprising amorphous silicon over said gate electrode with said insulating film interposed therebetween wherein said insulating film comprising silicon nitride contacts said first semiconductor film;

forming a second semiconductor film on said first semiconductor film;

patterning said first and second semiconductor films into a semiconductor island by using a second mask;

forming a conductive layer on the patterned second semiconductor film;

patterning the conductive layer to form source and drain electrodes by using a third mask wherein a portion of the patterned second semiconductor film is exposed between said source and drain electrodes and at least one of the source and drain electrodes extends beyond the outer side edge of the patterned first and second semiconductor films;

etching the exposed portion of the patterned second semiconductor film by using said source and drain electrodes as a mask to form source and drain regions and to expose a portion of said first semiconductor film between said source and drain regions;

forming a passivation film over said first semiconductor film, said source and drain regions, and said source and drain electrodes wherein said passivation film contacts the exposed portion of the first semiconductor film; and forming a pixel electrode over the passivation film.

14. A method according to claim 13 wherein said gate electrode comprises a material selected from the group consisting of chromium, aluminum and tantalum.

15. A method according to claim 13 wherein said first semiconductor film comprises intrinsic amorphous silicon.

16. A method according to claim 13 wherein said second semiconductor film has an n-type conductivity.

17. A method according to claim 13 wherein said conductive layer comprises chromium.

18. A method according to claim 13 wherein said insulating film is 1000 to 1500Å thick.

19. A method of manufacturing a semiconductor device comprising the steps of:

forming a gate electrode on an insulating surface by using a first mask;

forming an insulating film comprising silicon nitride;

forming a first semiconductor film comprising amorphous silicon over said gate electrode with said insulating film interposed therebetween wherein said insulating film comprising silicon nitride contacts said first semiconductor film;

forming a second semiconductor film on said first semiconductor film;

patterning said first and second semiconductor films by using a second mask;

forming a conductive layer on the patterned second semiconductor film;

patterning the conductive layer to form source and drain electrodes by using a third mask wherein a portion of the patterned second semiconductor film is exposed between said source and drain electrodes;

etching the exposed portion of the second semiconductor film to form source and drain regions and to expose a portion of said first semiconductor film between said source and drain regions;

forming a passivation film over said first semiconductor film, said source and drain regions, and said source and drain electrodes wherein said passivation film contacts the exposed portion of the first semiconductor film; and forming a pixel electrode over the passivation film wherein said insulating film, said first semiconductor film and said second semiconductor film are formed by plasma CVD in succession in a multi-chamber system.

20. A method according to claim 19 wherein said gate electrode comprises a material selected from the group consisting of chromium, aluminum and tantalum.

21. A method according to claim 19 wherein said first semiconductor film comprises intrinsic amorphous silicon.

22. A method according to claim 19 wherein said second semiconductor film has an n-type conductivity.

23. A method according to claim 19 wherein said conductive layer comprises chromium.

24. A method according to claim 19 wherein said insulating film is 1000 to 1500Å thick.

25. A method of manufacturing a semiconductor device comprising the steps of:

forming a gate electrode on an insulating surface by using a first mask;

forming an insulating film comprising silicon nitride;

forming a first semiconductor film comprising amorphous silicon over said gate electrode with said insulating film interposed therebetween wherein said insulating film comprising silicon nitride contacts said first semiconductor film;

forming a second semiconductor film on said first semiconductor film;

patterning said first and second semiconductor films by using a second mask;

forming a conductive layer on the patterned second semiconductor film;

patterning the conductive layer to form source and drain electrodes by using a third mask wherein a portion of the patterned second semiconductor film is exposed between said source and drain electrodes;

etching the exposed portion of the patterned second semiconductor film to form source and drain regions by using the source and drain electrodes as a mask and to expose a portion of the first semiconductor film between said source and drain regions;

forming a passivation film over said first semiconductor film, said source and drain regions, and said source and drain electrodes wherein said passivation film contacts the exposed portion of the first semiconductor film; and forming a pixel electrode over the passivation film, wherein said insulating film, said first semiconductor film and said second semiconductor film are formed by plasma CVD in succession in a multi-chamber system.

26. A method according to claim 25 wherein said gate electrode comprises a material selected from the group consisting of chromium, aluminum and tantalum.

27. A method according to claim 25 wherein said first semiconductor film comprises intrinsic amorphous silicon.

28. A method according to claim 25 wherein said second semiconductor film has an n-type conductivity.

29. A method according to claim 25 wherein said conductive layer comprises chromium.

30. A method according to claim 25 wherein said insulating film is 1000 to 1500Å thick.

31. A method of manufacturing a semiconductor device comprising the steps of:

forming a gate electrode on an insulating surface by using a first mask;

forming an insulating film comprising silicon nitride;

forming a first semiconductor film comprising amorphous silicon over said gate electrode with said insulating film interposed therebetween wherein said insulating film comprising silicon nitride contacts said first semiconductor film;

forming a second semiconductor film on said first semiconductor film;

patterning said first and second semiconductor films into a semiconductor island by using a second mask;

forming a conductive layer on the patterned second semiconductor film;

patterning the conductive layer to form source and drain electrodes by using a third mask wherein a portion of the patterned second semiconductor film is exposed between said source and drain electrodes and at least one of the source and drain electrodes extends beyond the outer side edge of the patterned first and second semiconductor films;

etching the exposed portion of the patterned second semiconductor film to form source and drain regions by using the source and drain electrodes as a mask and to expose a portion of the first semiconductor film between the source and drain regions;

forming a passivation film over said first semiconductor film, said source and drain regions, and said source and drain electrodes wherein said passivation film contacts the exposed portion of the first semiconductor film; and forming a pixel electrode over the passivation film, wherein said insulating film, said first semiconductor film and said second semiconductor film are formed by plasma CVD in succession in a multi-chamber system.

32. A method according to claim 31 wherein said gate electrode comprises a material selected from the group consisting of chromium, aluminum and tantalum.

33. A method according to claim 31 wherein said first semiconductor film comprises intrinsic amorphous silicon.

34. A method according to claim 31 wherein said second semiconductor film has an n-type conductivity.

35. A method according to claim 31 wherein said conductive layer comprises chromium.

36. A method according to claim 31 wherein said insulating film is 1000 to 1500Å thick.

37. A method of manufacturing a thin film transistor for switching a pixel electrode in an active matrix liquid crystal display device, said method comprising the steps of:

forming a gate electrode on an insulating surface by using a first mask;

forming an insulating film comprising silicon nitride;

forming a first semiconductor film comprising amorphous silicon over said gate electrode with said insulating film interposed therebetween wherein said insulating film comprising silicon nitride contacts said first semiconductor film;

forming a second semiconductor film on said first semiconductor film;

patterning said first and second semiconductor films by using a second mask;

forming a conductive layer on the patterned second semiconductor film;

patterning the conductive layer to form source and drain electrodes by using a third mask wherein a portion of the patterned second semiconductor film is exposed between said source and drain electrodes;

etching the exposed portion of the second semiconductor film to form source and drain regions and to expose a portion of the first semiconductor film between the source and drain regions;

forming a passivation film over said first semiconductor film, said source and drain regions, and said source and drain electrodes wherein said passivation film contacts the exposed portion of the first semiconductor film; and forming a pixel electrode over the passivation film.

38. A method according to claim 37 wherein said gate electrode comprises a material selected from the group consisting of chromium, aluminum and tantalum.

39. A method according to claim 37 wherein said first semiconductor film comprises intrinsic amorphous silicon.

40. A method according to claim 37 wherein said second semiconductor film has an n-type conductivity.

41. A method according to claim 37 wherein said conductive layer comprises chromium.

42. A method according to claim 37 wherein said insulating film is 1000 to 1500Å thick.

43. A method of manufacturing a thin film transistor for switching a pixel electrode in an active matrix liquid crystal display device, said method comprising the steps of:

forming a gate electrode on an insulating surface by using a first mask;

forming an insulating film comprising silicon nitride;

forming a first semiconductor film comprising amorphous silicon over said gate electrode with said insulating film interposed therebetween wherein said insulating film comprising silicon nitride contacts said first semiconductor film;

forming a second semiconductor film on said first semiconductor film;

patterning said first and second semiconductor films by using a second mask;

forming a conductive layer on the patterned second semiconductor film;

patterning the conductive layer to form source and drain electrodes by using a third mask wherein a portion of the patterned second semiconductor film is exposed between said source and drain electrodes;

etching the exposed portion of the patterned second semiconductor film to form source and drain regions by using the source and drain electrodes as a mask and to expose a portion of the first semiconductor film between the source and drain regions;

forming a passivation film over said first semiconductor film, said source and drain regions, and said source and drain electrodes wherein said passivation film contacts the exposed portion of the first semiconductor film; and forming a pixel electrode over the passivation film.

44. A method according to claim 43 wherein said gate electrode comprises a material selected from the group consisting of chromium, aluminum and tantalum.

45. A method according to claim 43 wherein said first semiconductor film comprises intrinsic amorphous silicon.

46. A method according to claim 43 wherein said second semiconductor film has an n-type conductivity.

47. A method according to claim 43 wherein said conductive layer comprises chromium.

48. A method according to claim 43 wherein said insulating film is 1000 to 1500Å thick.

49. A method of manufacturing a thin film transistor for switching a pixel electrode in an active matrix liquid crystal display device, said method comprising the steps of:

forming a gate electrode on an insulating surface by using a first mask;

forming an insulating film comprising silicon nitride;

forming a first semiconductor film comprising amorphous silicon over said gate electrode with said insulating film interposed therebetween wherein said insulating film comprising silicon nitride contacts said first semiconductor film;

forming a second semiconductor film on said first semiconductor film;

patterning said first and second semiconductor films into a semiconductor island by using a second mask;

forming a conductive layer on the patterned second semiconductor film;

patterning the conductive layer to form source and drain electrodes by using a third mask wherein a portion of the patterned second semiconductor film is exposed between said source and drain electrodes and at least one of the source and drain electrodes extends beyond the outer side edge of the patterned first and second semiconductor films;

etching the exposed portion of the patterned second semiconductor film to form source and drain regions by using the source and drain electrodes as a mask and to expose a portion of the first semiconductor film between the source and drain regions;

forming a passivation film over said first semiconductor film, said source and drain regions, and said source and drain electrodes wherein said passivation film contacts the exposed portion of the first semiconductor film; and forming a pixel electrode over the passivation film.

50. A method according to claim 49 wherein said gate electrode comprises a material selected from the group consisting of chromium, aluminum and tantalum.

51. A method according to claim 49 wherein said first semiconductor film comprises intrinsic amorphous silicon.

52. A method according to claim 49 wherein said second semiconductor film has an n-type conductivity.

53. A method according to claim 49 wherein said conductive layer comprises chromium.

54. A method according to claim 49 wherein said insulating film is 1000 to 1500Å thick.

55. The method according to claim 1, 7, 13, 19, 25, 31, 37, 43 or 49 wherein an oxide film is interposed between said gate electrode and said insulating film.

56. The method according to claim 1, 7, 13, 19, 25, 31, 37, 43 or 49 wherein said second semiconductor film is doped with phosphorus.

57. The method according to claim 1, 7, 13, 19, 25, 31, 37, 43 or 49 wherein said pixel electrode comprises indium tin oxide.

58. The method according to claim 1, 7, 13, 19, 25, 31, 37, 43 or 49 wherein said passivation film comprises silicon oxide.

59. A method of manufacturing a semiconductor device comprising the steps of:

forming a gate electrode on an insulating surface by using a first mask;

forming an insulating film comprising silicon nitride;

forming a first semiconductor film comprising amorphous silicon over said gate electrode with said insulating film interposed therebetween wherein said insulating film comprising silicon nitride contacts said first semiconductor film;

forming a second semiconductor film on said first semiconductor film;

patterning said first and second semiconductor films by using a second mask;

forming a metal layer on the patterned second semiconductor film;

patterning the metal layer to form source and drain electrodes by using a third mask wherein a portion of the patterned second semiconductor film is exposed between said source and drain electrodes;

etching the exposed portion of the second semiconductor film to form source and drain regions and to expose a portion of said first semiconductor film between said source and drain regions;

forming a passivation film over said first semiconductor film, said source and drain regions, and said source and drain electrodes wherein said passivation film contacts the exposed portion of the first semiconductor film; and forming a transparent pixel electrode over the passivation film.

60. A method according to claim 59 wherein said gate electrode comprises a material selected from the group consisting of chromium, aluminum and tantalum.

61. A method according to claim 59 wherein said first semiconductor film comprises intrinsic amorphous silicon.

62. A method according to claim 59 wherein said second semiconductor film has an n-type conductivity.

63. A method according to claim 59 wherein said metal layer comprises chromium.

64. A method according to claim 59 wherein said insulating film is 1000 to 5000Å thick.

65. A method of manufacturing a semiconductor device comprising the steps of:

forming a gate electrode on an insulating surface by using a first mask;

forming an insulating film comprising silicon nitride;

forming a first semiconductor film comprising amorphous silicon over said gate electrode with said insulating film interposed therebetween wherein said insulating film comprising silicon nitride contacts said first semiconductor film;

forming a second semiconductor film on said first semiconductor film;

patterning said first and second semiconductor films by using a second mask;

forming a metal layer on the patterned second semiconductor film;

patterning the metal layer to form source and drain electrodes by using a third mask wherein a portion of the patterned second semiconductor film is exposed between said source and drain electrodes;

etching the exposed portion of the patterned second semiconductor film to form source and drain regions by using said source and drain electrodes as a mask and to expose a portion of said first semiconductor film between said source and drain regions;

forming a passivation film over said first semiconductor film, said source and drain regions, and said source and drain electrodes wherein said passivation film contacts the exposed portion of the first semiconductor film; and forming a transparent pixel electrode over the passivation film.

66. A method according to claim 65 wherein said gate electrode comprises a material selected from the group consisting of chromium aluminum and tantalum.

67. A method according to claim 65 wherein said first semiconductor film comprises intrinsic amorphous silicon.

68. A method according to claim 65 wherein said second semiconductor film has an n-type conductivity.

69. A method according to claim 65 wherein said metal layer comprises chromium.

70. A method according to claim 65 wherein said insulating film is 1000 to 1500Å thick.

71. A method of manufacturing a semiconductor device comprising the steps of:

forming a gate electrode on an insulating surface by using a first mask;

forming an insulating film comprising silicon nitride;

forming a first semiconductor film comprising amorphous silicon over said gate electrode with said insulating film interposed therebetween wherein said insulating film comprising silicon nitride contacts said first semiconductor film;

forming a second semiconductor film on said first semiconductor film;

patterning said first and second semiconductor films into a semiconductor island by using a second mask;

forming a metal layer on the patterned second semiconductor film;

patterning the metal layer to form source and drain electrodes by using a third mask wherein a portion of the patterned second semiconductor film is exposed between said source and drain electrodes and at least one of the source and drain electrodes extends beyond the outer side edge of the patterned first and second semiconductor films;

etching the exposed portion of the patterned second semiconductor film by using said source and drain electrodes as a mask to form source and drain regions and to expose a portion of said first semiconductor film between said source and drain regions;

forming a passivation film over said first semiconductor film, said source and drain regions, and said source and drain electrodes wherein said passivation film contacts the exposed portion of the first semiconductor film; and forming a transparent pixel electrode over the passivation film.

72. A method according to claim 71 wherein said gate electrode comprises a material selected from the group consisting of chromium, aluminum and tantalum.

73. A method according to claim 71 wherein said first semiconductor film comprises intrinsic amorphous silicon.

74. A method according to claim 71 wherein said second semiconductor film has an n-type conductivity.

75. A method according to claim 71 wherein said metal layer comprises chromium.

76. A method according to claim 71 wherein said insulating film is 1000 to 1500Å thick.

77. A method of manufacturing a semiconductor device comprising the steps of:

forming a gate electrode on an insulating surface by using a first mask;

forming an insulating film comprising silicon nitride;

forming a first semiconductor film comprising amorphous silicon over said gate electrode with said insulating film interposed therebetween wherein said insulating film comprising silicon nitride contacts said first semiconductor film;

forming a second semiconductor film on said first semiconductor film;

patterning said first and second semiconductor films by using a second mask;

forming a metal layer on the patterned second semiconductor film;

patterning the metal layer to form source and drain electrodes by using a third mask wherein a portion of the patterned second semiconductor film is exposed between said source and drain electrodes;

etching the exposed portion of the second semiconductor film to form source and drain regions and to expose a portion of said first semiconductor film between said source and drain regions;

forming a passivation film over said first semiconductor film, said source and drain regions, and said source and drain electrodes wherein said passivation film contacts the exposed portion of the first semiconductor film; and forming a transparent pixel electrode over the passivation film wherein said insulating film, said first semiconductor film and said second semiconductor film are formed by plasma CVD in succession in a multi-chamber system.

78. A method according to claim 77 wherein said gate electrode comprises a material selected from the group consisting of chromium, aluminum and tantalum.

79. A method according to claim 77 wherein said first semiconductor film comprises intrinsic amorphous silicon.

80. A method according to claim 77 wherein said second semiconductor film has an n-type conductivity.

81. A method according to claim 77 wherein said metal layer comprises chromium.

82. A method according to claim 77 wherein said insulating film is 1000 to 1500Å thick.

83. A method of manufacturing a semiconductor device comprising the steps of:

forming a gate electrode on an insulating surface by using a first mask;

forming an insulating film comprising silicon nitride;

forming a first semiconductor film comprising amorphous silicon over said gate electrode with said insulating film interposed therebetween wherein said insulating film comprising silicon nitride contacts said first semiconductor film;

forming a second semiconductor film on said first semiconductor film;

patterning said first and second semiconductor films by using a second mask;

forming a metal layer on the patterned second semiconductor film;

patterning the metal layer to form source and drain electrodes by using a third mask wherein a portion of the patterned second semiconductor film is exposed between said source and drain electrodes;

etching the exposed portion of the patterned second semiconductor film to form source and drain regions by using the source and drain electrodes as a mask and to expose a portion of the first semiconductor film between said source and drain regions;

forming a passivation film over said first semiconductor film, said source and drain regions, and said source and drain electrodes wherein said passivation film contacts the exposed portion of the first semiconductor film; and forming a transparent pixel electrode over the passivation film, wherein said insulating film, said first semiconductor film and said second semiconductor film are formed by plasma CVD in succession in a multi-chamber system.

84. A method according to claim 83 wherein said gate electrode comprises a material selected from the group consisting of chromium, aluminum and tantalum.

85. A method according to claim 83 wherein said first semiconductor film comprises intrinsic amorphous silicon.

86. A method according to claim 83 wherein said second semiconductor film has an n-type conductivity.

87. A method according to claim 83 wherein said metal layer comprises chromium.

88. A method according to claim 83 wherein said insulating film is 1000 to 1500Å thick.

89. A method of manufacturing a semiconductor device comprising the steps of:
    forming a gate electrode on an insulating surface by using a first mask;
    forming an insulating film comprising silicon nitride;
    forming a first semiconductor film comprising amorphous silicon over said gate electrode with said insulating film interposed therebetween wherein said insulating film comprising silicon nitride contacts said first semiconductor film;
    forming a second semiconductor film on said first semiconductor film;
    patterning said first and second semiconductor films into a semiconductor island by using a second mask;
    forming a metal layer on the patterned second semiconductor film;
    patterning the metal layer to form source and drain electrodes by using a third mask wherein a portion of the patterned second semiconductor film is exposed between said source and drain electrodes and at least one of the source and drain electrodes extends beyond the outer side edge of the patterned first and second semiconductor films;
    etching the exposed portion of the patterned second semiconductor film to form source and drain regions by using the source and drain electrodes as a mask and to expose a portion of the first semiconductor film between the source and drain regions;
    forming a passivation film over said first semiconductor film, said source and drain regions, and said source and drain electrodes wherein said passivation film contacts the exposed portion of the first semiconductor film; and
    forming a transparent pixel electrode over the passivation film, wherein said insulating film, said first semiconductor film and said second semiconductor film are formed by plasma CVD in succession in a multi-chamber system.

90. A method according to claim 89 wherein said gate electrode comprises a material selected from the group consisting of chromium, aluminum and tantalum.

91. A method according to claim 89 wherein said first semiconductor film comprises intrinsic amorphous silicon.

92. A method according to claim 89 wherein said second semiconductor film has an n-type conductivity.

93. A method according to claim 89 wherein said metal layer comprises chromium.

94. A method according to claim 89 wherein said insulating film is 1000 to 1500Å thick.

95. A method of manufacturing a thin film transistor for switching a pixel electrode in an active matrix liquid crystal display device, said method comprising the steps of:
    forming a gate electrode on an insulating surface by using a first mask;
    forming an insulating film comprising silicon nitride;
    forming a first semiconductor film comprising amorphous silicon over said gate electrode with said insulating film interposed therebetween wherein said insulating film comprising silicon nitride contacts said first semiconductor film;
    forming a second semiconductor film on said first semiconductor film;
    patterning said first and second semiconductor films by using a second mask;
    forming a metal layer on the patterned second semiconductor film;
    patterning the metal layer to form source and drain electrodes by using a third mask wherein a portion of the patterned second semiconductor film is exposed between said source and drain electrodes;
    etching the exposed portion of the second semiconductor film to form source and drain regions and to expose a portion of the first semiconductor film between the source and drain regions;
    forming a passivation film over said first semiconductor film, said source and drain regions, and said source and drain electrodes wherein said passivation film contacts the exposed portion of the first semiconductor film; and
    forming a transparent pixel electrode over the passivation film.

96. A method according to claim 95 wherein said gate electrode comprises a material selected from the group consisting of chromium, aluminum and tantalum.

97. A method according to claim 95 wherein said first semiconductor film comprises intrinsic amorphous silicon.

98. A method according to claim 95 wherein said second semiconductor film has an n-type conductivity.

99. A method according to claim 95 wherein said metal layer comprises chromium.

100. A method according to claim 95 wherein said insulating film is 1000 to 1500Å thick.

101. A method of manufacturing a thin film transistor for switching a pixel electrode in an active matrix liquid crystal display device, said method comprising the steps of:
    forming a gate electrode on an insulating surface by using a first mask;
    forming an insulating film comprising silicon nitride;
    forming a first semiconductor film comprising amorphous silicon over said gate electrode with said insulating film interposed therebetween wherein said insulatng film comprising silicon nitride contacts said first semiconductor film;
    forming a second semiconductor film on said first semiconductor film;
    patterning said first and second semiconductor films by using a second mask;
    forming a metal layer on the patterned second semiconductor film;
    patterning the metal layer to form source and drain electrodes by using a third mask wherein a portion of the patterned second semiconductor film is exposed between said source and drain electrodes;
    etching the exposed portion of the patterned second semiconductor film to form source and drain regions by using the source and drain electrodes as a mask and to expose a portion of the first semiconductor film between the source and drain regions;
    forming a passivation film over said first semiconductor film, said source and drain regions, and said source and drain electrodes wherein said passivation film contacts the exposed portion of the first semiconductor film; and
    forming a transparent pixel electrode over the passivation film.

102. A method according to claim 101 wherein said gate electrode comprises a material selected from the group consisting of chromium, aluminum and tantalum.

103. A method according to claim 101 wherein said first semiconductor film comprises intrinsic amorphous silicon.

104. A method according to claim 101 wherein said second semiconductor film has an n-type conductivity.

105. A method according to claim 101 wherein said metal layer comprises chromium.

106. A method according to claim 101 wherein said insulating film is 1000 to 1500Å thick.

107. A method of manufacturing a thin film transistor for switching a pixel electrode in an active matrix liquid crystal display device, said method comprising the steps of:

forming a gate electrode on an insulating surface by using a first mask;

forming an insulating film comprising silicon nitride;

forming a first semiconductor film comprising amorphous silicon over said gate electrode with said insulating film interposed therebetween wherein said insulating film comprising silicon nitride contacts said first semiconductor film;

forming a second semiconductor film on said first semiconductor film;

patterning said first and second semiconductor films into a semiconductor island by using a second mask;

forming a metal layer on the patterned second semiconductor film;

patterning the metal layer to form source and drain electrodes by using a third mask wherein a portion of the patterned second semiconductor film is exposed between said source and drain electrodes and at least one of the source and drain electrodes extends beyond the outer side edge of the patterned first and second semiconductor films;

etching the exposed portion of the patterned second semiconductor film to form source and drain regions by using the source and drain electrodes as a mask and to expose a portion of the first semiconductor film between the source and drain regions;

forming a passivation film over said first semiconductor film, said source and drain regions, and said source and drain electrodes wherein said passivation film contacts the exposed portion of the first semiconductor film; and forming a transparent pixel electrode over the passivation film.

108. A method according to claim 107 wherein said gate electrode comprises a material selected from the group consisting of chromium, aluminum and tantalum.

109. A method according to claim 107 wherein said first semiconductor film comprises intrinsic amorphous silicon.

110. A method according to claim 107 wherein said second semiconductor film has an n-type conductivity.

111. A method according to claim 107 wherein said metal layer comprises chromium.

112. A method according to claim 107 wherein said insulating film is 1000 to 1500Å thick.

113. The method according to any one of claims 59, 65, 71, 77, 83, 89, 95, 101 or 107 wherein an oxide film is interposed between said gate electrode and said insulating film.

114. The method according to any one of claims 59, 65, 71, 77, 83, 89, 95, 101 or 107 wherein an oxide semiconductor film is doped with phosphorus.

115. The method according to any one of claims 59, 65, 71, 77, 83, 89, 95, 101 or 107 wherein said passivation film comprises silicon oxide.

* * * * *